(12) United States Patent
Yoon

(10) Patent No.: US 12,315,590 B2
(45) Date of Patent: May 27, 2025

(54) MEMORY DEVICE CONFIGURED TO REDUCE VERIFICATION TIME AND OPERATING METHOD THEREOF INCLUDING DUMP OPERATIONS

(71) Applicant: Samsung Electronics Co., Ltd., Suwon-si (KR)

(72) Inventor: Hyunjun Yoon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 211 days.

(21) Appl. No.: 18/064,442

(22) Filed: Dec. 12, 2022

(65) Prior Publication Data

US 2023/0367480 A1    Nov. 16, 2023

(30) Foreign Application Priority Data

May 16, 2022    (KR) .................. 10-2022-0059818

(51) Int. Cl.
*G11C 7/10* (2006.01)
*G06F 3/06* (2006.01)

(52) U.S. Cl.
CPC .......... *G11C 7/1084* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 5,903,495 A * | 5/1999 | Takeuchi | G11C 11/5642 365/185.24 |
| 7,684,253 B2 | 3/2010 | Kim | |
| 8,054,692 B2 | 11/2011 | Kang et al. | |
| 9,424,942 B2 | 8/2016 | Shim | |
| 9,947,394 B2 | 4/2018 | Yoon | |
| 10,978,113 B2 | 4/2021 | Chun | |
| 11,069,396 B2 | 7/2021 | Choi et al. | |
| 2002/0126531 A1* | 9/2002 | Hosono | G11C 16/26 365/185.17 |
| 2007/0014163 A1* | 1/2007 | Kim | G11C 16/0483 365/189.12 |
| 2010/0329032 A1* | 12/2010 | Lim | G11C 11/5628 365/185.24 |

(Continued)

FOREIGN PATENT DOCUMENTS

KR    20110109370 A    10/2011

*Primary Examiner* — J. H. Hur
(74) *Attorney, Agent, or Firm* — Myers Bigel, P.A.

(57) ABSTRACT

A memory device includes a memory cell array having memory cells therein that are programed to a plurality of program states, and a page buffer circuit having a plurality of page buffers therein that are connected to a plurality of bit lines associated with the memory cell array. Each of the page buffers includes a sensing latch that is connected to a corresponding one of the plurality of bit lines, and is configured to control a precharge operation performed on a corresponding bit line. Control logic is provided to control a verification operation performed on the plurality of program states within the memory cells by controlling the page buffer circuit, a plurality of dump operations on the sensing latch, which are based on values of at least two bits stored in each of the page buffers, and a selective precharge of bit lines that are connected to memory cells to be programmed to a first program state to be verified, from among the plurality of program states.

19 Claims, 15 Drawing Sheets

(56) References Cited

U.S. PATENT DOCUMENTS

| | | | | |
|---|---|---|---|---|
| 2014/0153329 A1* | 6/2014 | Kang | ..................... | G11C 16/26 365/185.21 |
| 2015/0039809 A1* | 2/2015 | Kim | ................... | G11C 16/0483 711/103 |
| 2015/0049545 A1* | 2/2015 | Jo | ..................... | G11C 16/3459 365/185.03 |

* cited by examiner

| | E | P1 | P2 | P3 | P4 | P5 | P6 | P7 |
|---|---|---|---|---|---|---|---|---|
| MSB | 1 | 1 | 1 | 1 | 0 | 0 | 0 | 0 |
| CSB | 1 | 1 | 0 | 0 | 0 | 0 | 1 | 1 |
| LSB | 1 | 0 | 0 | 1 | 1 | 0 | 0 | 1 |

P2: SELECTED PROGRAM STATE
P5: UNSELECTED PROGRAM STATE

Dump 2 (In Verification Section)

Dump 1 (In Dump Section)

FIG. 12

|  | Dump 1 | Dump 2 | Dump 3 | ... |
|---|---|---|---|---|
| Case 1 | Dump Section | | | |
| Case 2 | Dump Section | | | Verification Section |
| Case 3 | Dump Section | | Verification Section | |
| Case 4 | Dump Section | Verification Section | | |
| Case 5 | Verification Section | | | |

MEMORY DEVICE CONFIGURED TO REDUCE VERIFICATION TIME AND OPERATING METHOD THEREOF INCLUDING DUMP OPERATIONS

REFERENCE TO PRIORITY APPLICATION

This application claims priority under 35 U.S.C. § 119 to Korean Patent Application No. 10-2022-0059818, filed May 16, 2022, the disclosure of which is hereby incorporated herein by reference.

BACKGROUND

The inventive concept relates to a memory device, and more particularly, to a memory device configured to reduce a verification time associated with memory programming and an operating method thereof.

In recent years, the multi-functionalization of information communication devices has led to a need for large-capacity highly integrated memory devices. A memory device may include a page buffer circuit configured to store data in memory cells or output data from the memory cells. The page buffer circuit may include a plurality of page buffers located to correspond to a plurality of bit lines.

Also, each of the page buffers may include a plurality of latches including a data latch, which is configured to temporarily store write data, and a sensing latch, which is configured to sense data. In this case, during a data program operation, a verification operation may be performed to determine a program pass or fail condition. When the verification operation is performed, data dumping operations may be performed a plurality of times between a plurality of latches, and a program time of the memory device may increase due to the time required for the data dumping operations. As a result, the performance of the memory device may degrade.

SUMMARY

The inventive concept provides a technique for improving the program performance of a memory device by reducing a time required for data dumping operations during a verification operation.

According to an aspect of the inventive concept, there is provided a memory device including a memory cell array having memory cells therein, which are programed to a plurality of program states according to a program operation, a page buffer circuit having a plurality of page buffers therein that are connected to a plurality of bit lines, with each of the page buffers including a sensing latch connected to a bit line corresponding thereto, and with each sensing latch controlling a precharge operation performed on the bit line. Control logic is provided, which is configured to control a verification operation performed on the plurality of program states by controlling the page buffer circuit. In addition, a plurality of dump operations are performed on the sensing latches, based on values of at least two bits stored in each of the page buffers, to thereby selectively precharge selected bit lines connected to memory cells to be programmed to a first program state to be verified, from among the plurality of program states. Advantageously, the control logic controls the plurality of dump operations such that some of the plurality of dump operations are performed in a dump section prior to a verification section, and some others of the plurality of dump operations are performed in the verification section in which the bit lines are precharged.

According to another aspect of the inventive concept, there is provided an operating method of a memory device, which includes performing a program loop in response to a receipt of a program command, and resetting sensing latches of a plurality of page buffers during the verification of a first program state after the program loop is performed, with the first program state being selected from a plurality of program states. A first dump operation is performed to dump data of a first bit, from among data of a plurality of bits to be programmed, to the sensing latches. Selected bit lines and unselected bit lines are precharged together due to the first dump operation, with the selected bit lines being connected to memory cells to be programmed to the first program state, from among a plurality of bit lines, and the unselected bit lines being connected to memory cells to be programmed to a second program state different from the first program state. A second dump operation is performed to dump data of a second bit, from among the data of the plurality of bits, to the sensing latches, and discharge the unselected bit lines based on the second dump operation.

According to another aspect of the inventive concept, there is provided a memory device including: (i) a memory cell array including memory cells, which are programmed to a plurality of program states according to a program operation, (ii) a page buffer circuit including a plurality of page buffers connected to a plurality of bit lines, with each of the page buffers including a plurality of data latches configured to store data and a sensing latch configured to control a precharge operation performed on a bit line corresponding thereto, and (iii) control logic configured to control a verification operation performed on the plurality of program states by controlling the page buffer circuit. The plurality of page buffers include a first page buffer connected to a memory cell to be programmed to a first program state and a second page buffer connected to a memory cell to be programmed to a second program state. The verification operation performed on the first program state includes a dump section in which the data stored in the plurality of data latches is dumped to the sensing latch and a verification section in which the plurality of bit lines are precharged. The control logic controls a precharge operation such that, after a first bit line connected to the first page buffer and a second bit line connected to the second page buffer are precharged together in the verification section, the second bit line is discharged.

BRIEF DESCRIPTION OF THE DRAWINGS

Embodiments of the inventive concept will be more clearly understood from the following detailed description taken in conjunction with the accompanying drawings in which:

FIGS. 12 and 13 illustrate examples of variously setting a timing of a dump operation according to embodiments.

DETAILED DESCRIPTION OF THE EMBODIMENTS

Hereinafter, embodiments will be described in detail with reference to the accompanying drawings.

Figure 1:
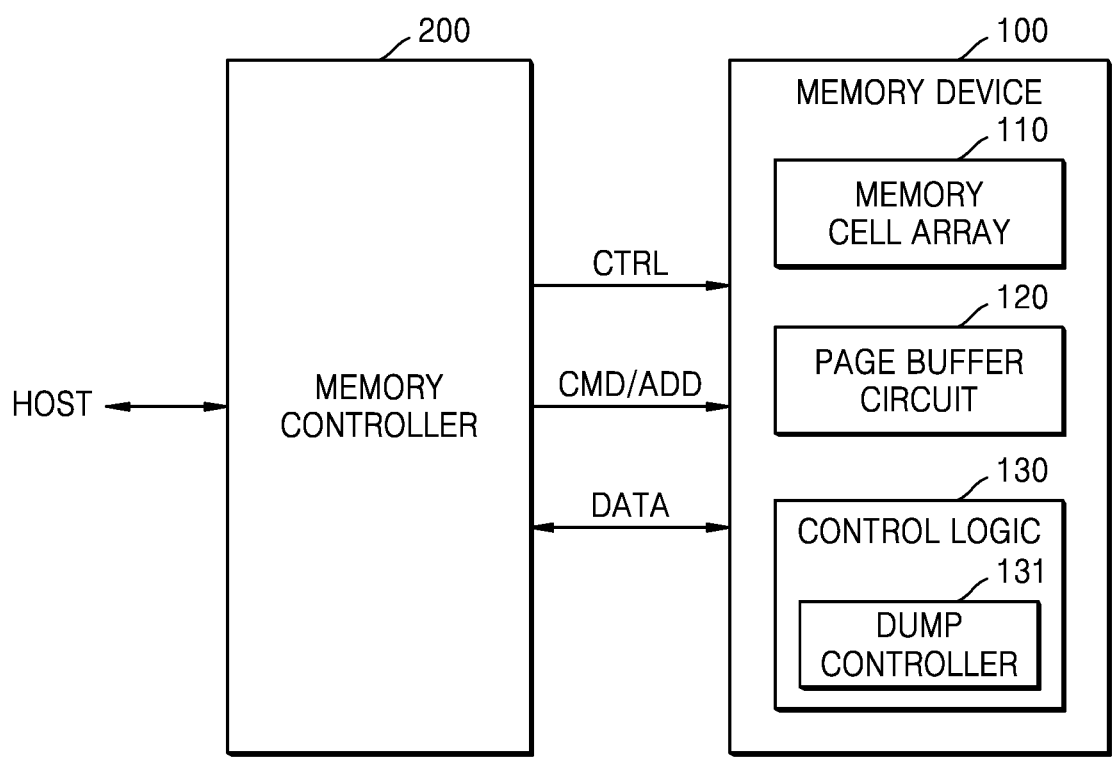
FIG. 1 is a block diagram of a memory system according to an embodiment.

FIG. 1 is a block diagram of a memory system 10 according to an embodiment. The memory system 10 may include a memory device 100 and a memory controller 200. The memory device 100 may be a non-volatile memory device configured to store data in a non-volatile manner. For example, the memory device 100 may be a flash memory device including flash memory cells. Alternatively, the memory device 100 may be a memory device (e.g., resistive random access memory (ReRAM), magnetic RAM (MRAM), and phase-change RAM (PRAM)) including resistive memory cells. In the following description of embodiments, it is assumed that the memory device 100 is a flash memory device including flash memory cells.

The memory controller 200 may control the memory device 100 to read data DATA stored in the memory device 100 or write (or program) data DATA to the memory device 100, in response to a write/read request from a host HOST. Specifically, the memory controller 200 may provide a command CMD and an address ADDR to the memory device 100, and control program, read, and erase operations performed on the memory device 100. Also, write data DATA and read data DATA may be transmitted and received between the memory controller 200 and the memory device 100.

As will be understood by those skilled in the art, the memory controller 200 may communicate with an external host through various standard interfaces. For example, the memory controller 200 may include an interface circuit (not shown), which may provide various standard interfaces between the host and the memory controller 200. The standard interface may include various interface methods, such as advanced technology attachment (ATA), serial ATA (SATA), external SATA (e-SATA), small computer small interface (SCSI), serial attached SCSI (SAS), PCI, PCI express (PCI-E), IEEE 1394, a universal serial bus (USB), a secure digital (SD) card, a multi-media card (MMC), an embedded MMC (eMMC), a universal flash storage (UFS), and a compact flash (CF) card interface.

Moreover, the memory device 100 may include a memory cell array 110, a page buffer circuit 120, and a control logic 130. Assuming that the memory cell array 110 includes flash memory cells, the memory cell array 110 may include a plurality of NAND strings in some embodiments.

The page buffer circuit 120 may store data to be stored to the memory cell array 110 and data read from the memory cell array 110. The page buffer circuit 120 may be connected to the memory cell array 110 through a plurality of bit lines, and a page buffer may be located to correspond to each of the bit lines. Each of page buffers may include a plurality of latches. Hereinafter, terms may be defined in various ways in the description of embodiments, and a page buffer circuit will be defined as including a page buffer connected to each bit line. However, in embodiments, the terms may be defined differently. In an example, one page buffer may be provided to correspond to the plurality of bit lines, and a unit of a component arranged to correspond to each bit line may be defined as a page buffer unit.

The control logic 130 may control all operations of the memory device 100. For example, the control logic 130 may control the memory device 100 to perform a memory operation corresponding to commands/addresses CMD/ADD and a control signal CTRL provided from the memory controller 200. In an example, the control logic 130 may generate various internal control signals used in the memory device 100 by processing the commands/addresses CMD/ADD and the control signal CTRL. According to an embodiment, the control logic 130 may adjust voltage levels of voltages provided to word lines and the bit lines during a memory operation, such as program and read operations. In addition, the program operation may be completed by performing a plurality of program loops, and a verification operation may be performed to correspond to at least some of the plurality of program loops. The control logic 130 may perform various control operations related to the program loops and the verification operation.

Memory cells included in the memory cell array 110 may have a plurality of threshold voltage distributions according to programmed data. For example, when the memory cell array 110 includes a single-level cell (SLC) configured to store one bit per memory cell, the memory cells may have two threshold voltage distributions according to a program state. Alternatively, when the memory cell array 110 includes a multi-level cell (MLC) configured to store two bits per memory cell, the memory cells may have four threshold voltage distributions according to a program state. In addition, when the memory cell array 110 stores at least three bits per memory cell, the memory cells may have at least eight threshold voltage distributions according to a program state.

A plurality of program loops may be performed to program the memory cell array 110. After each of the program loops is performed, a verification operation may be performed to determine program pass or fail. In an embodiment, when each memory cell is an MLC configured to store 2-bit data, a threshold voltage distribution may have an erase state E and first to third program states P1 to P3, and the verification operation may be sequentially performed on the first to third program states P1 to P3.

In an embodiment, when a verification operation is performed on memory cells to be programmed to the first program state P1, a precharge operation may be selectively performed only on bit lines connected to the memory cells to be programmed to the first program state P1, from among the bit lines connected to the plurality of memory cells (e.g., selective bit line precharge verification (Selective BL Precharge Verify)). That is, when the first program state P1 of a plurality of program states is selected as a state in which the verification operation is to be performed, to perform the verification operation, the bit lines connected to the memory cells to be programmed to the first program state P1 may be selectively precharged. That is, in the verification operation, a selective precharge operation and a data sensing operation may be performed on some of the plurality of bit lines included in the memory cell array 110, while some other bit lines may be maintained at a predetermined voltage level (e.g., a ground voltage level) without performing the precharge operation.

In an embodiment, whether to precharge a bit line may be determined based on information stored in a sensing latch connected to the bit line through a sensing node. For example, when information of logic "1" (or logic high) is stored in the sensing latch in the page buffer, a power supply voltage may be applied to a bit line corresponding to the page buffer, based on an operation of a switch included in the sensing latch, and thus, the bit line may be precharged. In contrast, when information of logic "0" (or logic low) is stored in the sensing latch in the page buffer, the bit line corresponding to the page buffer may not be precharged.

A plurality of dump operations may be formed to store information for a selective precharge operation in the sensing latch. The dump operations may refer to operations associated with moving at least one bit stored in each page buffer to the sensing latch. For example, whenever the dump operation is performed on the sensing latch, a state of the sensing latch may be changed into a set state or a reset state. A bit line corresponding to the sensing latch may or may not be precharged according to the state of the sensing latch.

In an example, when 2-bit data is stored in each memory cell, a program state (or a position of a threshold voltage distribution) of a memory cell to be programmed may be determined by two bits of data. Accordingly, at least two dump operations may be performed to select a bit line corresponding to a program state to be verified. As the number of bits stored in each memory cell increases, the number of dump operations may increase. Because a dump section for performing the dump operations is included in a data program/verification operation, a data program time may increase.

According to the embodiment, some of the plurality of dump operations may be performed in parallel with a bit line precharge operation. Assuming that the dump section is followed by a verification section in relation to the verification operation, the verification section may include a bit line precharge section in which a voltage level of a bit line is raised to a predetermined precharge level by performing a selective precharge operation on the bit line. Some of the plurality of dump operations may be performed in the bit line precharge section.

The dump controller 131 may control the dump operations. According to the embodiment, the dump controller 131 may control timings at which the plurality of dump operations are performed. In an embodiment, the dump controller 131 may control the dump operations by implementing a hardware circuit. In a modifiable example, the dump operations may be controlled by software or based on a combination of hardware and software.

According to the embodiment described above, bit lines (hereinafter, unselected bit lines) corresponding to at least one other state, which is not selected, may be further precharged along with bit lines (hereinafter, selected bit lines) corresponding to the first program state P1, which is selected for the verification operation. That is, because only some of the plurality of dump operations are performed before the bit line precharge section starts, when the bit line precharge section starts, not only selected bit lines corresponding to a program state to be verified, but also unselected bit lines corresponding to at least one other program state may be precharged together.

Thereafter, because the remaining dump operations are performed in the bit line precharge section, information stored in sensing latches connected to the unselected bit lines may be changed. In an example, logic-low information may be stored in the sensing latches connected to the unselected bit lines due to the remaining dump operations. Thus, the precharge operation on the unselected bit lines may be interrupted, and the unselected bit lines may be discharged. That is, because the unselected bit lines are discharged, only the selected bit lines may be precharged to a target level, and memory cells that are to be programmed to the first program state P1 may be verified.

According to the embodiment described above, during the verification operation, some of the plurality of dump operations for the selective precharge operation may be performed simultaneously with the verification section. As a result, a total time required for the program operation may be reduced, and the program performance of the memory device 100 may be improved. According to the embodiment, the plurality of bit lines may include selected bit lines connected to memory cells having a selected program state and first unselected bit lines connected to memory cells having at least one unselected program state that is not to be verified. In addition, the plurality of bit lines may further include second unselected bit lines including bit lines connected to memory cells having another unselected program state, which is not to be verified, and bit lines connected to memory cells, which are determined as program pass and thus inhibited from being programmed. According to the embodiment, when the verification section starts, while the selected bit lines and the first unselected bit lines are being precharged together, a dump operation may be further performed and completed. Accordingly, the memory device 100 may have operating characteristics in which the first unselected bit lines are selectively discharged. In addition, the second unselected bit lines may not be precharged but maintained at a predetermined voltage level (e.g., a ground voltage level).

Moreover, the memory device 100 and the memory controller 200 may be integrated into one semiconductor device. In an example, the memory device 100 and the memory controller 200 may be integrated into one semiconductor device to constitute a memory card. For example, the memory device 100 and the memory controller 200 may be integrated into one semiconductor device and constitute a personal computer (PC) card (PCMCIA), a compact flash (CF) card, a smart media card (SM/SMC), a memory stick, a multimedia card (e.g., MMC, RS-MMC, and MMCmicro), an SD card (e.g., SD, miniSD, and microSD), and/or a UFS. In another example, the memory device 100 and the memory controller 200 may be integrated into one semiconductor device to constitute a solid-state disk/drive (SSD).

Figure 2:
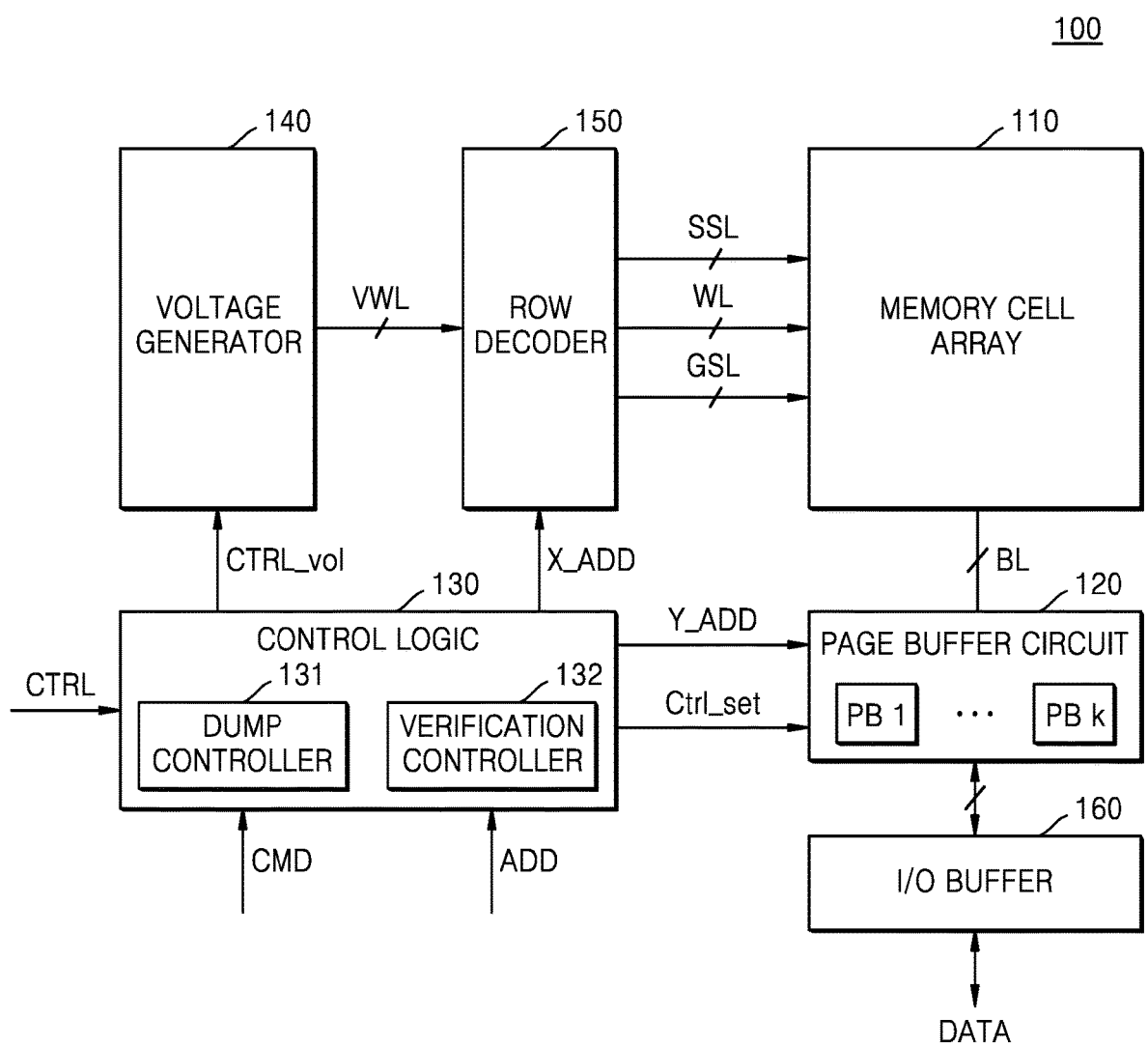
FIG. 2 is a block diagram of an exemplary embodiment of a memory device shown in FIG. 1.

FIG. 2 is a block diagram of an embodiment of the memory device 100 of FIG. 1. Referring to FIGS. 1 and 2, the memory device 100 may include a memory cell array 110, a page buffer circuit 120, control logic 130, a voltage generator 140, a row decoder 150, and an input/output (I/O) buffer 160). Also, the control logic 130 may include a dump controller 131 and a verification controller 132. Although not shown in FIG. 2, the memory device 100 may further include various other functional blocks (e.g., an I/O interface) related to a memory operation.

The memory cell array 110 may include a plurality of memory cells, which may be connected to word lines WL, a string selection line SSL, a ground selection line GSL, and bit lines BL. Specifically, the memory cell array 110 may be connected to the row decoder 150 through the word lines WL, the string selection line SSL, and the ground selection line GSL and connected to the page buffer circuit 120 through bit lines BL.

The memory cell array 110 may include a plurality of cell blocks, each of which may have a two-dimensional (2D) structure (or a planar structure) or a three-dimensional (3D) structure (or a vertical structure). The memory cell array 110 may include the plurality of memory cells, which may store one bit or at least two bits per cell.

The page buffer circuit 120 may be connected to the bit lines BL and temporarily store write data or temporarily store read data. The page buffer circuit 120 may include a plurality of page buffers (e.g., first to k-th page buffers PB 1 to PB k) to correspond to the bit lines BL, and each of the page buffers may be connected to a bit line BL corresponding thereto through a sensing node (not shown).

The control logic 130 may output various internal control signals for programming data to the memory cell array 110, reading data from the memory cell array 110, or erasing data stored in the memory cell array 110, based on a command CMD, an address ADDR, and a control signal CTRL, which are received from the memory controller 200. Various internal control signals output by the control logic 130 may be provided to the page buffer circuit 120, the voltage generator 140, and the row decoder 150. Specifically, the control logic 130 may provide a voltage control signal CTRL_vol to the voltage generator 140. The voltage generator 140 may generate voltages having various levels based on the voltage control signal CTRL_vol. In an example, the voltage generator 140 may provide word line voltages VWL having various levels, which are related to program/read/erase operations, to the row decoder 150. The control logic 130 may provide a row address X_ADD to the address decoder 150 and provide a column address Y_ADD to the page buffer circuit 120.

Each of the first to k-th page buffers PB 1 to PB k may include a plurality of latches, which include a latch used to sense data and a latch configured to temporarily store data to be programmed. As an embodied example, when a latch configured to store data to be programmed is referred to as a data latch, a page buffer may include a plurality of data latches configured to temporarily store data of a plurality of bits. For example, when each memory cell is a triple-level cell (TLC) configured to store 3-bit data, a page buffer may include at least three data latches configured to store 3-bit data. In addition, each of the first to k-th page buffers PB 1 to PB k may further include a sensing latch, which is connected to a sensing node (not shown) and latches sensed data.

In an embodiment, the verification controller 132 may control a verification operation performed on programmed memory cells. In an example, the verification controller 132 may read data from memory cells on which a program loop has been performed, and control a verification operation for determining program pass or fail, based on a logic state of the read data. Furthermore, the verification controller 132 may control an operation of selectively precharging the bit line BL, based on information stored in the sensing latch of each of the page buffers.

In an embodiment, the dump controller 131 may control an operation of dumping data stored in at least one data latch to the sensing latch. In one example, the dump controller 131 may generate a dump control signal Ctrl_set for setting a state (e.g., a set state or a reset state) of the first to k-th page buffers PB 1 to PB k, based on the dump operation.

Also, the dump controller 131 may control a timing at which the dump operation is performed. In an embodiment, the dump controller 131 may perform a control operation such that the bit line precharge operation and the dump operation are performed in parallel by performing some dump operations in a dump section before a verification section starts and performing some other dump operations in the verification section. For example, when data of two bits is stored in each memory cell, to verify a specific program state, two dump operations may be performed to dump two bits (e.g., most significant bit (MSB) data and least significant bit (LSB) data) to the sensing latch. One dump operation may be performed in the dump section, while another dump operation may be performed in the verification section.

Moreover, due to the dump operation, the sensing latch may store logic-high information or logic-low information. In an embodiment, when the sensing latch stores the logic-high information, the sensing latch may be referred to as having the set state, and a bit line BL connected to the sensing latch having the set state may be precharged. In contrast, when the sensing latch stores the logic low information, the sensing latch may be referred to as having the reset state, and a bit line BL connected to the sensing latch having the reset state may be discharged or inhibited from being precharged.

According to the embodiment described above, to verify a specific selected program state, when the verification section starts, unselected bit lines corresponding to at least one unselected program state may be precharged along with selected bit lines corresponding to a selected program state. Thereafter, because an additional dump operation is performed in the verification section, the sensing latches connected to the unselected bit lines may be controlled to have the reset state. Accordingly, the unselected bit lines may be discharged, while only the selected bit lines may be selectively precharged.

Moreover, in embodiments, the dump operation may be performed in various manners. For example, due to the dump operation, a bit value of data may be moved to the sensing latch, and thus, the sensing latch may have the set state or the reset state. Alternatively, in the dump operation, data that is in a specific logic state (e.g., logic 1) may be selectively dumped to the sensing latch. In this case, the sensing latch may have the set state or the reset state according to the dump operation. In an example, whenever the dump operation is performed, a state of the sensing latch may be alternately switched between the set state and the reset state.

Alternatively, in an embodiment, the dump operation may be selectively performed according to a logic state of 2 bits or more. For example, when 2-bit data stored in each page buffer has a specific logic state, the sensing latch may have the set state or the reset state due to the dump operation. In an example, when all the 2-bit data has a value of logic "0," the dump operation may be performed.

In the following embodiments, the dump operation may be performed in various ways. Thus, the embodiments are not limited to a specific dump method. In addition, when data is dumped to the sensing latch, the sensing latch may be described as being changed into the set state or the reset state.

Figure 3:
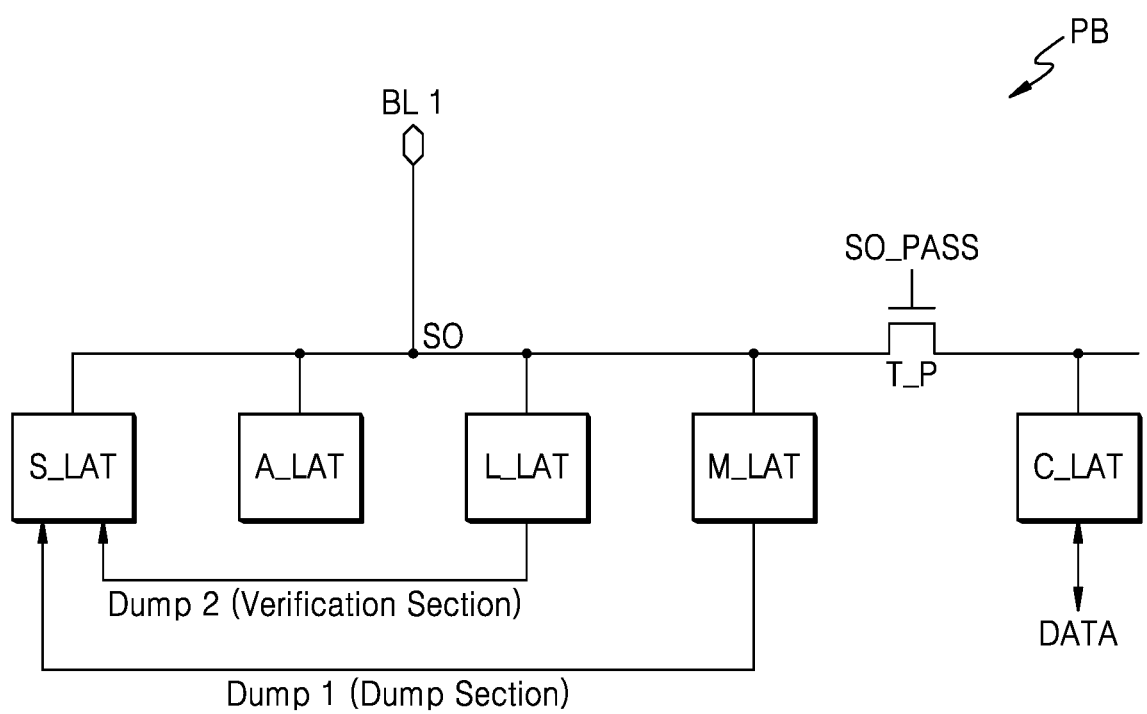
FIG. 3 illustrates a page buffer according to an embodiment.

FIG. 3 is a diagram of a page buffer according to an embodiment. A schematic configuration of a page buffer PB connected to a first bit line BL 1 is illustrated in FIG. 3, and the illustration of various transistors between the first bit line BL 1 and latches is omitted. Also, a page buffer circuit may include a plurality of page buffers PB shown in FIG. 3 to correspond to bit lines.

Referring to FIG. 3, the page buffer PB may be connected to the first bit line BL 1 through a sensing node SO, and may include a cache latch C_LAT, which may receive, from the outside, data to be programmed in memory cells, and store the data. As shown, the cache latch C_LAT may be electrically connected to multiple other latches in the page buffer PB through a pass transistor T_P, and the pass transistor T_P may be turned on or off in response to a pass signal SO_PASS, which is provided to a gate terminal of the pass transistor. When the pass transistor T_P is turned on, data may be transmitted between the cache latch C_LAT and other latches.

The page buffer PB may further include a plurality of latches connected to the sensing node SO. In an example, the page buffer PB may further include a sensing latch S_LAT, a first data latch (or an LSB latch L_LAT) and a second data latch (or an MSB latch M_LAT). In an embodiment, the page buffer PB may include at least one additional latch A_LAT. Each of the at least one additional latch A_LAT may be used in relation to data program/read operations. For example, the additional latch A_LAT may temporarily store data during the data program operation or temporarily store sensed data during the data read operation. Alternatively, the additional latch A_LAT may be used to store forcing information during the application of a forcing program. In an embodiment, a plurality of bits of data to be programmed may be stored in at least two latches among the cache latch C_LAT, the additional latch A_LAT, the first data latch L_LAT, and the second data latch M_LAT.

In a read or program verification operation, the sensing latch S_LAT may store a result of sensing of data stored in a memory cell. Also, a precharge operation may be selectively performed on the first bit line BL 1 based on information stored in the sensing latch S_LAT. In addition, when the additional latch A_LAT is used for the forcing program to improve a threshold voltage distribution, a voltage level to which the first bit line BL 1 corresponding to the page buffer PB is precharged may be changed according to a value stored in the additional latch A_LAT. Alternatively, in an embodiment, when the additional latch A_LAT stores data, the data stored in the additional latch A_LAT may be dumped to the sensing latch S_LAT.

A plurality of program loops may be performed to program data. In each program state, a verification operation may be performed to determine program pass or fail. To apply a selective bit line precharge operation to the verification operation according to the embodiment described above, a dump operation of dumping data to the sensing latch S_LAT may be performed at least twice. For example, when a memory cell stores 2-bit data, LSB data may be stored in the first data latch L_LAT, and MSB data may be stored in the second data latch M_LAT. In this case, a first dump operation of dumping the MSB data stored in the second data latch M_LAT to the sensing latch S_LAT and a second dump operation of dumping the LSB data stored in the first data latch L_LAT to the sensing latch S_LAT may be performed. According to the embodiment, after the first dump operation is performed in a dump section, the process may enter a verification section. When the verification section starts, from among a plurality of bit lines, bit lines corresponding to the sensing latch S_LAT having a set state may be selectively precharged.

Thereafter, the second dump operation may be performed during the verification section. Accordingly, from among the sensing latches S_LAT having the set state due to the first dump operation, some sensing latches S_LAT may have a reset state due to the second dump operation. Accordingly, when the verification section starts, from among the plurality of bit lines that are precharged, some bit lines corresponding to the sensing latches S_LAT that are changed into the reset state may be discharged, and bit lines corresponding to a selected program state that is actually verified may be selectively precharged.

In an operation example, from among data stored in the first data latch L_LAT and the second latch M_LAT, data having a value of 0 may be selectively dumped to the sensing latch S_LAT. For example, when a memory cell connected to the first bit line BL 1 is programed to a first program state, LSB data may have a value of 1, and MSB data may have a value of 0. During the verification of the first program state, when the first bit line BL 1 corresponds to a selected bit line, MSB data stored in the second data latch M_LAT may have a value of 0 and thus be dumped to the sensing latch S_LAT. Accordingly, the sensing latch S_LAT may have the set state. Also, when the verification section starts, the first bit line BL 1 may be precharged. In addition, when the verification section starts, a dump operation may be selectively performed based on a value of LSB data stored in the first data latch L_LAT. When the value of LSB data corresponds to 1, an additional dump operation need not be performed on the sensing latch S_LAT. Because the sensing latch S_LAT maintains the set state, the first bit line BL 1 may remain precharged.

In contrast, when the memory cell connected to the first bit line BL 1 is programmed to a second program state, both LSB data and MSB data may have a value of 0. During the verification of the first program state, when the first bit line BL 1 corresponds to an unselected bit line, MSB data stored in the second data latch M_LAT may have a value of 0 and thus dumped to the sensing latch S_LAT. Accordingly, the sensing latch S_LAT may have the set state. Also, when the verification section starts, the first bit line BL 1 may be precharged. Subsequently, when the verification section starts, a dump operation may be selectively performed based on a value of LSB data stored in the first data latch L_LAT. When the value of LSB data corresponds to 0, an additional dump operation may be performed on the sensing latch S_LAT. By performing the dump operation, a state of the sensing latch S_LAT may be changed. For example, the sensing latch S_LAT may be changed from the set state into the reset state, and thus, the first bit line BL 1 may be discharged.

Figure 4:
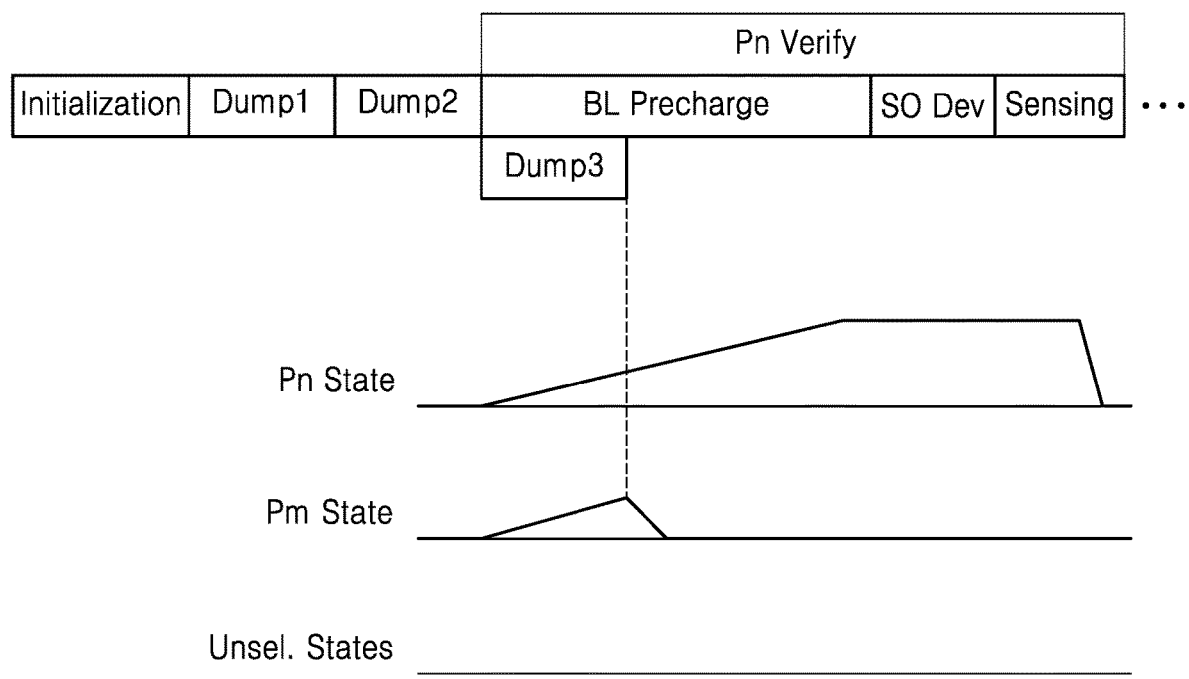
FIG. 4 illustrates an example of a variation in the voltage of a bit line in a dump section and a verification section, according to an embodiment.

FIG. 4 illustrates an example of a variation in the voltage of a bit line in a dump section and a verification section, according to an embodiment. Dump operations may be performed a plurality of times based on various conditions, such as the number of bits stored in each memory cell and a program state to be verified. FIG. 4 illustrates an example in which dump operations are performed three times.

In order to verify a selected program state (e.g., a Pn state) after a program loop is performed, an initialization operation for setting sensing latches connected to a plurality of bit lines to the same state may be performed. For example, by controlling the sensing latches, the sensing latches may be set to a set state or a reset state. In an embodiment, it is assumed that the sensing latches are set to the reset state due to the initialization operation.

Thereafter, in an example, when the dump section starts, some of the three dump operations may be performed in the dump section, and first and second dump operations Dump 1 and Dump 2 are performed in the dump section. When only the first and second dump operations Dump 1 and Dump 2 are performed as some dump operations, sensing latches connected to unselected bit lines corresponding to at least one unselected program state (e.g., a Pm state) may have the set state along with sensing latches connected to selected bit lines corresponding to the selected program state (e.g., the Pn state).

Thereafter, when the verification section starts, the bit lines connected to the sensing latches having the set state may be precharged. Accordingly, voltage levels of the selected bit lines and the unselected bit lines corresponding to the Pm state may be raised together. In addition, the verification section may include a bit line precharge section in which the bit lines are precharged, a sensing node developing section in which a voltage level of a sensing node is changed due to the electrical connection of the bit line with the sensing node, and a sensing section in which information stored in the sensing latch is sensed. According to the embodiment, at least one dump operation (e.g., a third dump operation Dump 3) may be performed in the bit line precharge section. In an embodiment, the third dump operation Dump 3 may be completed before the sensing node developing section starts. In an example, the third dump operation Dump 3 may be performed in response to the start of the bit line precharge section.

When the third dump operation Dump 3 is performed, some of a plurality of sensing latches having the set state may be changed into the reset state. In an example, the sensing latches connected to the unselected bit lines corresponding to the Pm state may be changed into the reset state. Accordingly, the unselected bit lines corresponding to the sensing latches that are changed into the reset state may be discharged, and a voltage level of the unselected bit lines may be lowered again. In an example, the unselected bit lines may be discharged to a ground voltage level.

Moreover, even after the first and second dump operations Dump 1 and Dump 2 are performed, sensing latches corresponding to some other unselected program states may maintain the reset state. As shown in FIG. 4, because the bit lines connected to the sensing latches that maintain the reset state are not precharged, the bit lines may be maintained at the ground voltage level. In addition, from memory cells that are programmed to the selected program state (or the Pn state), sensing latches corresponding to memory cells that are determined as program pass due to a previous or an existing program loop and thus set to program inhibit may maintain the reset state, and bit lines connected to the memory cells set to program inhibit may be maintained at a ground voltage level.

According to the operation as described above, from among a plurality of bit lines included in a memory device, selected bit lines may be precharged to a predetermined target level, while unselected bit lines may be discharged again during a precharge operation or maintained at a ground voltage level.

Figure 5:
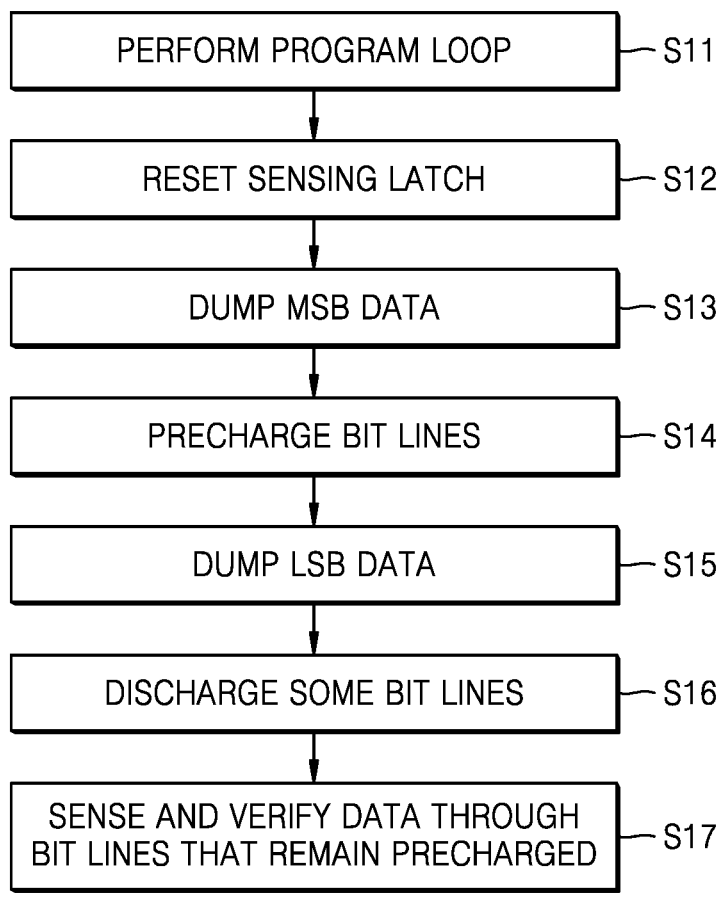
FIG. 5 is a flowchart of an operating method of a memory device, according to an embodiment.

FIG. 5 is a flowchart of an operating method of a memory device according to an embodiment. FIG. 5 illustrates a case in which, when each memory cell stores data of at least two bits, a first dump operation of dumping MSB data to a sensing latch and a second dump operation of dumping LSB data to the sensing latch are performed in a verification operation.

The memory device may program data to a page unit including a plurality of memory cells connected to a plurality of bit lines, and program data of the page unit to the memory cells by performing a plurality of program loops (S11). After the program loop is performed, the verification operation may be performed to determine program pass or fail. An additional program loop may not be performed on the memory cells that are determined as program pass.

To enable the verification operation, an operation of initializing the sensing latch may be performed. In an example, the sensing latch may be reset due to the initialization operation (S12). In an example, the reset operation may be performed on all sensing latches connected to a plurality of bit lines. Accordingly, a plurality of sensing latches corresponding to the page unit may have a reset state.

Subsequently, to enable a selective bit line precharge operation, a dump operation may be performed on the sensing latch based on data stored in at least two data latches included in each page buffer. In an example, an operation of dumping MSB data stored in any one data latch to the sensing latch may be performed in the dump section (S13). And, responsive to the dump operation, from among a plurality of page buffers, a page buffer configured to store MSB data having a predetermined bit value (e.g., a value of 0) may have a sensing latch that may be changed into a set state. When a bit line precharge section starts, bit lines connected to sensing latches having the set state may be precharged (S14).

Because a precharge operation is performed in a state of dumping data of 1 bit from among data of 2 bits, unselected bit lines corresponding to at least one unselected program state may be precharged along with selected bit lines corresponding to a program state to be actually verified. Thereafter, in a verification section, before the bit line precharge section is completed, an operation of dumping LSB data stored in another data latch to the sensing latch may be performed (S15). Accordingly, sensing latches connected to memory cells that are in the unselected program state may be changed into the reset state.

The unselected bit lines connected to the sensing latches that are changed into the reset state may be discharged (S16). Thus, selected bit lines connected to memory cells on which an actual verification is to be performed may be selectively precharged. In addition, a data sensing operation may be performed through the selected bit lines that remain precharged, and a verification operation may be performed to determine program pass or fail based on the sensed data (S17).

Figure 6:
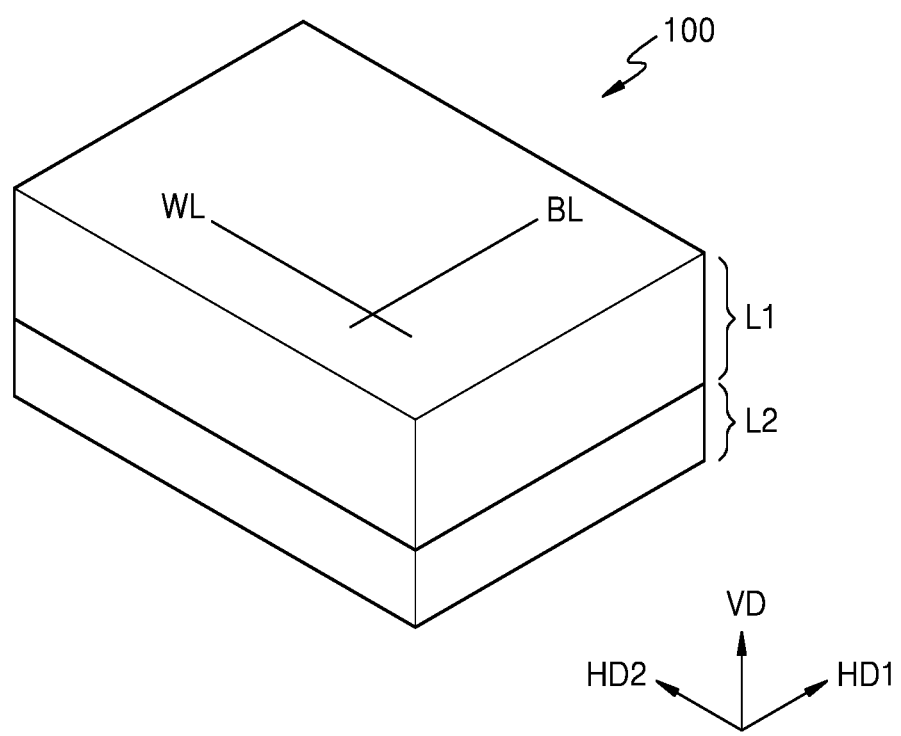
FIG. 6 illustrates a schematic structure of the memory device of FIG. 1.

FIG. 6 illustrates a schematic structure of the memory device of FIG. 1. A cell over periphery (COP) structure is illustrated as an example of the memory device 100 in FIG. 6, but embodiments are not limited thereto, and the memory device 100 may be implemented by using various structures. Referring to FIGS. 1 to 6, the memory device 100 may include a first semiconductor layer L1 and a second semiconductor layer L2, and the first semiconductor layer L1 may be stacked on the second semiconductor layer L2 in a vertical direction VD. Specifically, the second semiconductor layer L2 may be under the first semiconductor layer L1 in the vertical direction VD. Thus, the second semiconductor layer L2 may be closer to an underlying substrate.

In an embodiment, the memory cell array 110 of FIG. 1 may be formed in the first semiconductor layer L1, and a peripheral circuit of FIG. 1 may be formed in the second semiconductor layer L2. Thus, the memory device 100 may have a structure (i.e., the COP structure) in which the memory cell array 110 is over the peripheral circuit. The COP structure may effectively reduce a lateral area (i.e., "footprint") of the memory device 100 and thereby increase the integration density of the memory device 100.

In an embodiment, the second semiconductor layer L2 may include the substrate, and transistors and metal patterns for wiring the transistors may be formed on the substrate. Thus, the peripheral circuit may be formed on the second semiconductor layer L2. After the peripheral circuit is formed in the second semiconductor layer L2, the first semiconductor layer L1 including the memory cell array 110 may be formed, and metal patterns configured to electrically connect word lines WL and bit lines BL of the memory cell array 110 to the peripheral circuit formed in the second semiconductor layer L2 may be formed. For instance, the bit lines BL may extend in a first lateral direction HD1, and the word lines WL may extend in a second lateral direction HD2.

Figure 7:
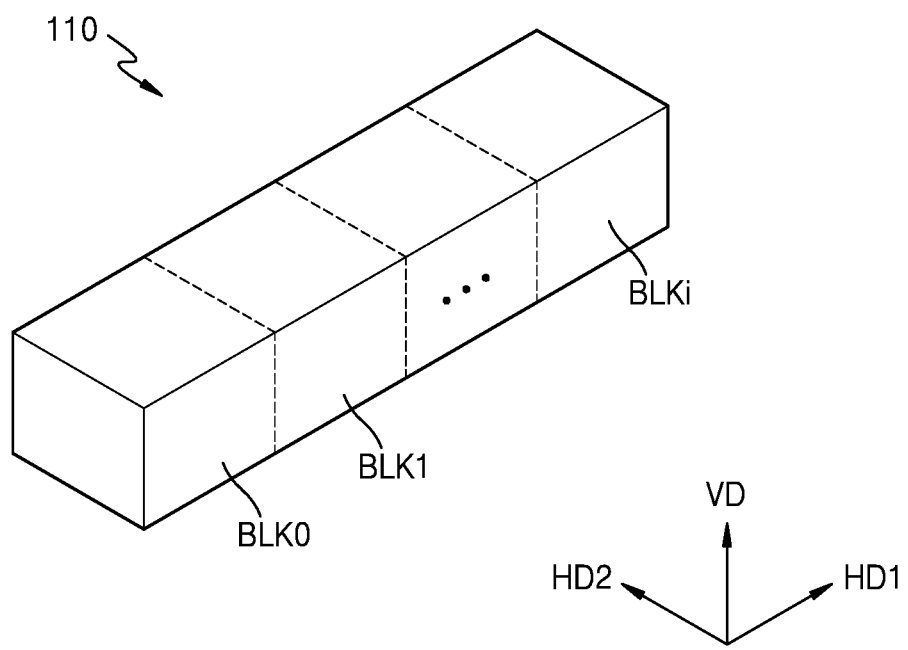
FIG. 7 illustrates an example of a memory cell array of FIG. 1, according to an embodiment.

FIG. 7 illustrates an example of the memory cell array 110 of FIG. 1, according to an embodiment. Referring to FIGS. 1 to 7, the memory cell array 110 may include a plurality of memory blocks BLK0 to BLKi, and i may be a positive integer. Each of the plurality of memory blocks BLK0 to BLKi may have a three-dimensional (3D) structure (or a vertical structure). Specifically, each of the plurality of memory blocks BLK0 to BLKi may include a plurality of NAND strings, which extend in a vertical direction VD. In this case, the plurality of NAND strings may be a predetermined distance apart from each other in first and second lateral directions HD1 and HD2. The plurality of memory blocks BLK0 to BLKi may be selected by the row decoder 150. For example, the row decoder 150 may select a memory block corresponding to a block address, from among the plurality of memory blocks BLK0 to BLKi.

Figure 8:
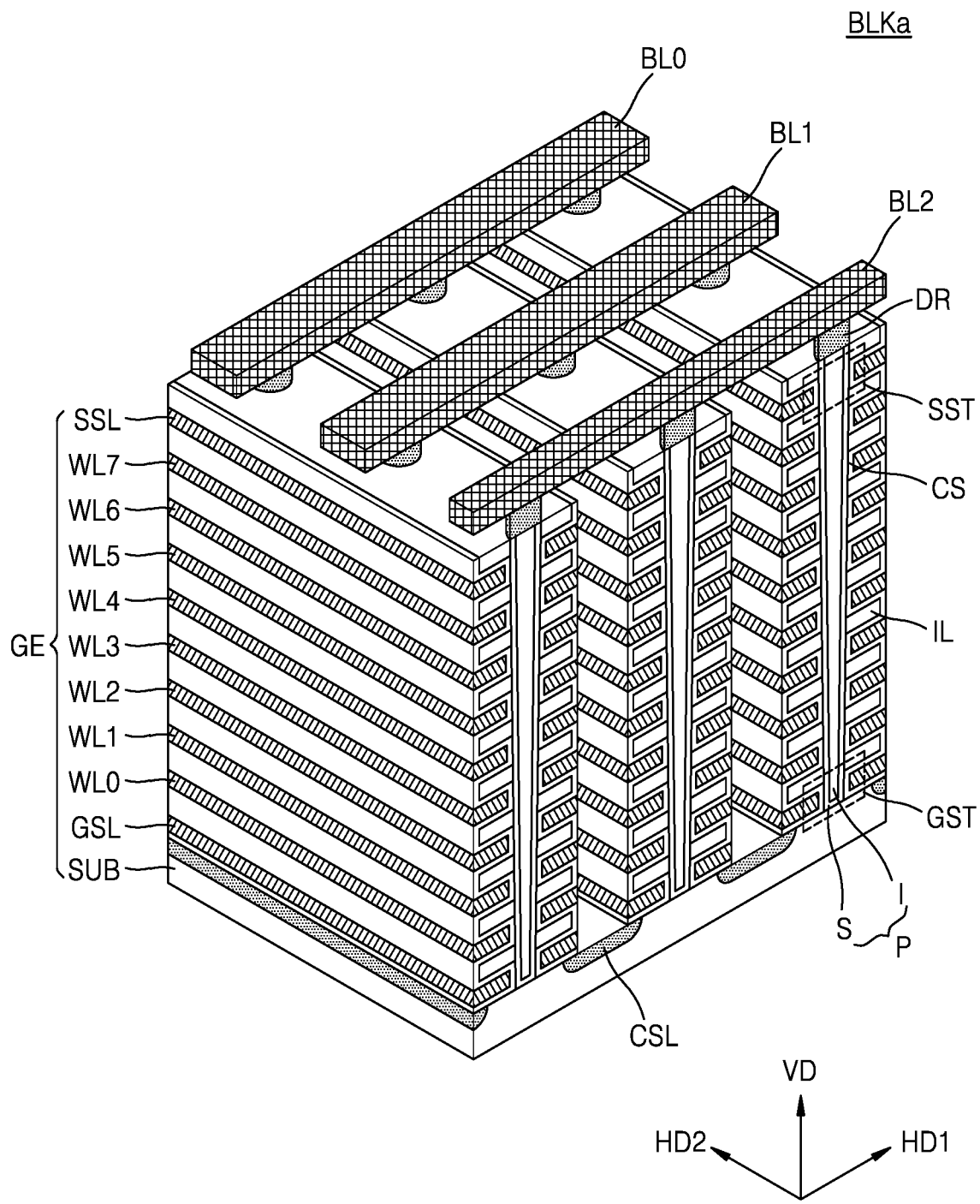
FIG. 8 is a perspective view of a memory block of FIG. 7, according to an embodiment.

FIG. 8 is a perspective view of the memory block BLKa of FIG. 7, according to an embodiment. Referring to FIGS. 1 to 8, a memory block BLKa may be formed in a vertical direction VD to a substrate SUB. The substrate SUB may be of a first conductivity type (e.g., p type). A common source line CSL doped with impurities of a second conductivity type (e.g., n type) may be provided on the substrate SUB and extend in a second lateral direction HD2. On the substrate SUB between two adjacent common source lines CSL, a plurality of insulating films IL extending in the second lateral direction HD2 may be sequentially provided in the vertical direction VD, and the plurality of insulating films IL may be a predetermined distance apart from each other in the vertical direction VD. For example, the plurality of insulating films IL may include an insulating material, such as silicon oxide.

On the substrate SUB between two adjacent common source lines CSL, a plurality of pillars P may be sequentially arranged in a first lateral direction HD1 and pass through the plurality of insulating films IL in the vertical direction VD. For example, the plurality of pillars P may be brought into contact with the substrate SUB by passing through the plurality of insulating films IL. Specifically, a surface layer S of each of the pillars P may include a silicon material of a first type and function as a channel region. Moreover, an inner layer I of each of the pillars P may include an insulating material (e.g., silicon oxide) or an air gap.

In a region between two adjacent common source lines CSL, a charge storage layer CS may be provided along exposed surfaces of the insulating films IL, the pillars P, and the substrate SUB. The charge storage layer CS may include a gate insulating layer (or also referred to as a 'tunneling insulating layer'), a charge trap layer, and a block insulating layer. For example, the charge storage layer CS may have an oxide-nitride-oxide (ONO) structure. In a region between two adjacent common source lines CSL, a gate electrode GE including, for example, selected lines GSL and SSL and word lines WL0 to WL7, may be provided on an exposed surface of the charge storage layer CS.

Drains (or drain contacts) DR may be provided on the plurality of pillars P, respectively. For example, the drains (or drain contacts) DR may include a silicon material doped with impurities of the second conductivity type. On the drains DR, bit lines BL0 to BL2 may extend in the first lateral direction HD1 and be a predetermined distance apart from each other in the second lateral direction HD2.

Figure 9A:
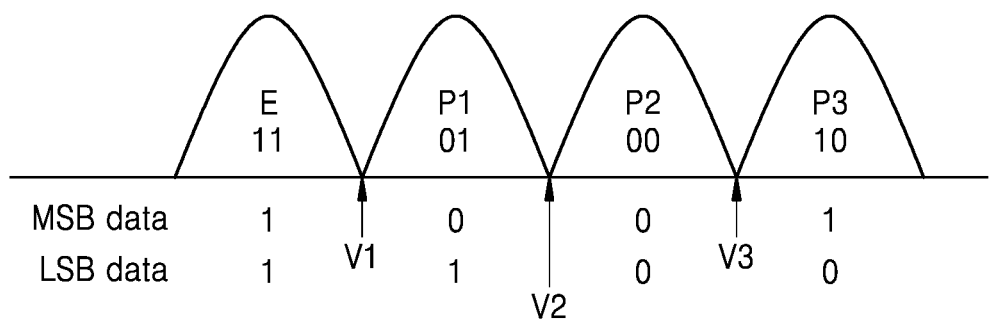
FIG. 9A illustrates an example of a threshold voltage distribution of memory cells according to an embodiment.
Figure 9B:
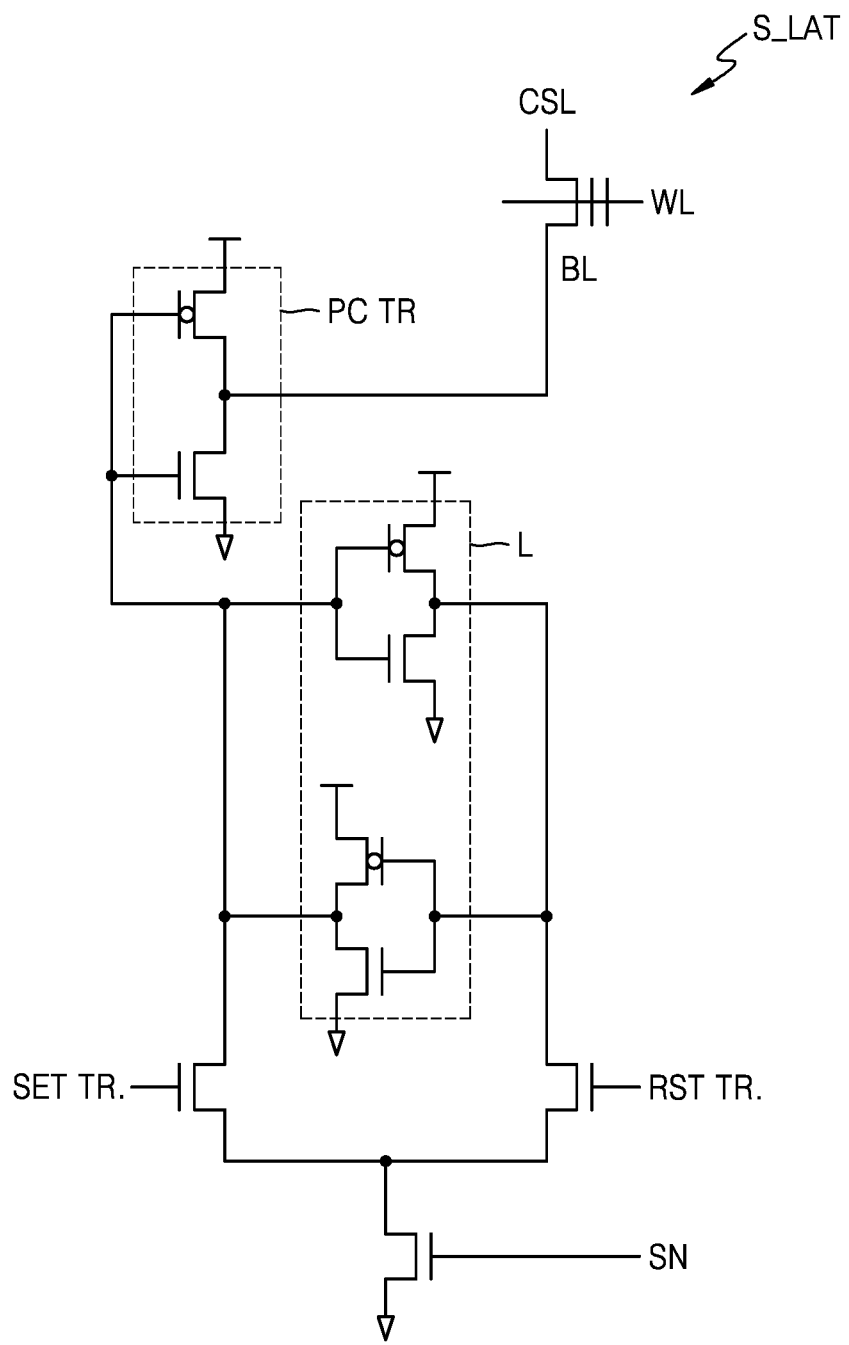
FIG. 9B illustrates an example of a sensing latch according to an embodiment.

FIG. 9A illustrates an example of a threshold voltage distribution of memory cells according to an embodiment, and FIG. 9B illustrates an example of a sensing latch according to an embodiment. FIGS. 9A and 9B illustrate an example in which when each memory cell includes 2-bit data, memory cells include four threshold voltage distributions. Each memory cell may store MSB data and LSB data. According to bit values of MSB data and LSB data to be programmed, each memory cell may have an erase state E or be programmed to any one of first to third program states P1 to P3. For example, when both MSB data and LSB data programmed to a memory cell have a value of 1, the memory cell may have the erase state E, and thus, a program loop may not be performed. In contrast, when MSB data has a value of 0 and LSB data has a value of 1, the corresponding memory cell may be programmed to the first program state P1. Also, when both MSB data and LSB data have a value of 0, the corresponding memory cell may be programmed to the second program state P2. When MSB data has a value of 1 and LSB data has a value of 0, the corresponding memory cell may be programmed to the third program state P3.

After the program loop is performed, a verification operation may be performed in each of the first to third program states P1 to P3. When the verification operation is performed in the first program state P1, only bit lines connected to memory cells to which data "10" is to be written may be selectively precharged. Similarly, when the verification operation is performed in the second program state P2, only bit lines connected to memory cells to which data "00" is to be written may be selectively precharged. When the verification operation is performed in the third program state P3, only bit lines connected to memory cells to which data "01" is to be written may be selectively precharged. These selective precharging operations also advantageously eliminate unnecessary power consumption, among other benefits.

Moreover, the verification operation may be performed by determining an on-cell or an off-cell based on a predetermined verification level. In an example, a first verification voltage V1 may be used to verify the first program state P1, a second verification voltage V2 may be used to verify the second program state P2, and a third verification voltage V3 may be used to verify the third program state P3.

Moreover, FIG. 9B illustrates an embodied example of the sensing latch S_LAT connected to one bit line BL, and each memory cell may be connected to a word line WL and a common source line CSL, which correspond thereto. The sensing latch S_LAT may include a latch circuit L configured to store 1-bit information, and the latch circuit L may be connected to a set transistor SET TR and a reset transistor RST TR. In addition, the sensing latch S_LAT may further include a transistor of which a gate is connected to a sensing node SN. In a sensing operation, a logic state of data stored in the latch circuit L may be flipped according to a voltage level applied to the sensing node SN. Furthermore, in a turned-on state of the transistor connected to the sensing node SN, a state of the sensing latch S_LAT may be adjusted to a set state or a reset state by controlling the set transistor SET TR and the reset transistor RST TR.

The sensing latch S_LAT may further include a precharge transistor portion PC TR, which is connected to the bit line BL and controls a precharge operation performed on the bit line BL. In an embodied example, the precharge transistor portion PC TR may include a PMOS transistor connected to a power supply voltage and an NMOS transistor connected to a ground voltage. A voltage level of one end of the set transistor SET TR may be complementary to a voltage level of one end of the reset transistor RST TR. In an example, when the sensing latch S_LAT is in the set state, the latch circuit L may store information corresponding to 1, whereas, when the sensing latch S_LAT is in the reset state, the latch circuit L may store information corresponding to 0.

The precharge operation on the bit line BL may be controlled according to a value of information stored in the sensing latch S_LAT. In an example, when the latch circuit L stores information corresponding to 1, a voltage having a voltage level corresponding to a logic low may be applied to a gate of the precharge transistor portion PC TR. Because the PMOS transistor connected to the power supply voltage is turned on, a voltage level of the bit line BL may rise. In contrast, when the latch circuit L stores information corresponding to 0, a voltage having a voltage level corresponding to a logic high may be applied to the gate of the precharge transistor portion PC TR. Because the NMOS transistor connected to the ground voltage is turned on, the voltage level of the bit line BL may drop.

In an embodiment, after a dump operation is performed by using some of a plurality of pieces of data, when a bit line precharge section may start, bit lines corresponding to at least one unselected program state may be precharged together. Thus, voltage levels of the bit lines may rise. Subsequently, because a dump operation is performed by using the remaining pieces of data in the bit line precharge section, sensing latches connected to unselected bit lines corresponding to an unselected program state may be changed into a reset state. As the state of the sensing latches changes, the unselected bit lines may be discharged.

Figure 10:
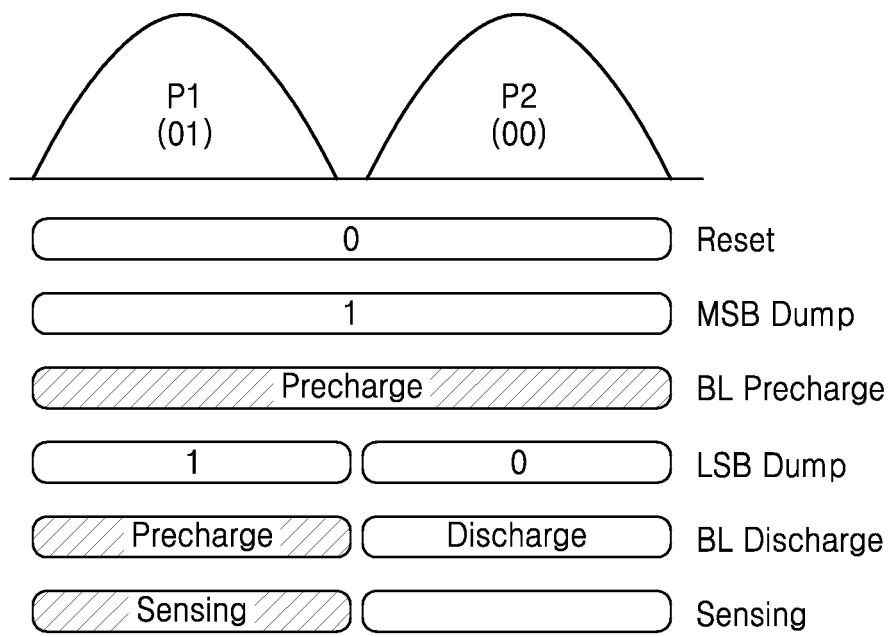
FIG. 10 illustrates an example of performing a verification operation according to an embodiment.

FIG. 10 illustrates an example of performing a verification operation according to an embodiment. FIG. 10 illustrates a case in which a first program state P1 corresponds to a selected program state when the verification operation is performed. In connection with operations of dumping a plurality of pieces of data to a sensing latch, FIG. 10 illustrates a case in which a first dump operation of dumping MSB data is performed before a verification section starts, while a second dump operation of dumping LSB data is performed after the verification section starts.

To begin with, sensing latches of page buffers connected to a plurality of bit lines may be reset by storing information of logic "0" in the sensing latches. Accordingly, the sensing latches may have a reset state. Subsequently, due to the dump operations, a state of the sensing latches may be changed from a set state to the reset state or changed from the reset state to the set state. From among MSB data stored in a plurality of page buffers, MSB data having a value of 0 may be selectively dumped to the sensing latches.

Because the first dump operation is performed in a dump section, MSB data having a value of 0 may be dumped to the sensing latch. Due to the first dump operation, a state of some sensing latches may be changed from the reset state to the set state. In the first program state P1 and a second program state P2, because MSB data has the value of 0, sensing latches of the page buffers corresponding to memory cells to be programmed to the first program state P1 and the second program state P2 may be changed into the set state.

After the first dump operation described above is performed, the dump section may end, and the verification section may start. Thus, a bit line precharge section may start. When the bit line precharge section starts, bit lines connected to sensing latches having the set state may be precharged. Thus, a precharge operation may be performed on bit lines connected to memory cells to be programmed to the first program state P1 and the second program state P2. In the bit line precharge section, a second dump operation may be performed based on LSB data. In an example, from among LSB data stored in the plurality of page buffers, LSB data having a value of 0 may be selectively dumped to the sensing latches.

In the second program state P2, because LSB data has the value of 0, sensing latches connected to memory cells to be programmed to the second program state P2 may be changed from the set state into the reset state due to the second dump operation. Accordingly, a discharge operation may be performed on bit lines connected to the memory cells to be programmed to the second program state P2, and only bit lines connected to memory cells to be programmed to the first program state P1 may be selectively precharged to a target level. Also, data stored in the memory cells to be programmed to the first program state P1 may be sensed and used to determine program pass or fail.

Figure 11:
FIG. 11 illustrates an example of a dump operation in a triple-level cell (TLC), according to an embodiment.
Figure 11:

FIG. 11 illustrates an example of a dump operation in a TLC, according to an embodiment. Because each of memory cells corresponds to a TLC configured to store 3-bit data, the memory cells may have an erase state E and first to seventh program states P1 to P7. Also, because the second program state P2 corresponds to a selected program state for a verification operation, FIG. 11 illustrates an example in which bit lines connected to memory cells to be programmed to the second program state P2 correspond to selected bit lines.

In an embodiment, a dump operation may be performed based on bit values of LSB data and central significant bit (CSB) data, and a dump operation performed based on a combination of the LSB data and the CSB data may be defined as a first dump operation. In addition, a dump operation based on MSB data may be defined as a second dump operation, the first dump operation may be performed in a dump section, and the second dump operation may be performed in a verification section. However, embodiments are not limited thereto. A dump operation based on LSB data may be defined as the first dump operation, a dump operation based on CSB data may be defined as the second dump operation, and a dump operation based on MSB data may be defined as a third dump operation.

All sensing latches connected to a plurality of bit lines may have a reset state. Thereafter, in the first dump operation, a dump operation may be performed on sensing latches included in page buffers in which both LSB data and CSB data have a value of 0, and thus, the sensing latches on which the dump operation has been performed may be changed into a set state. Accordingly, bit lines connected to memory cells to be programmed to the second program state P2 and the fifth program state P5 may be precharged together.

Subsequently, a second dump operation based on MSB data may be performed in the verification section, and a dump operation may be performed on sensing latches included in page buffers in which MSB data has a value of 0. Accordingly, sensing latches corresponding to the fifth program state P5 may be changed into a reset state, and a discharge operation may be performed on the bit lines connected to the memory cells to be programmed to the fifth program state P5. In the above-described process, only bit lines connected to memory cells to be programmed to the second program state P2 corresponding to a selected program state may be selectively precharged to a target level.

Figure 13:
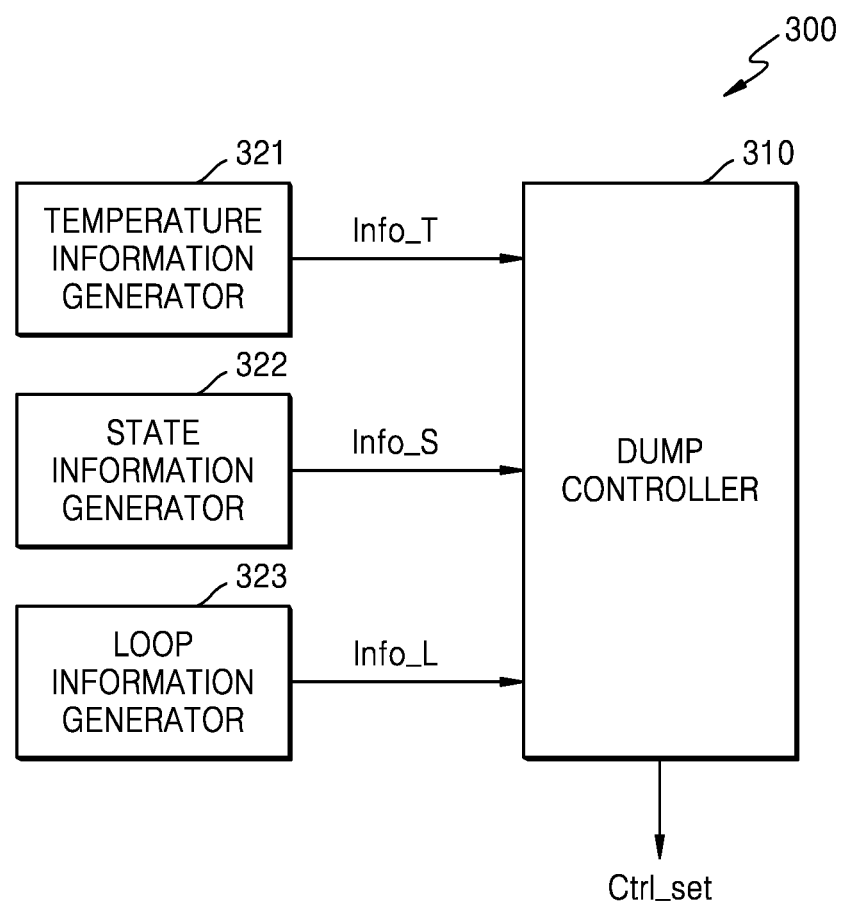

FIGS. 12 and 13 illustrate examples of variously setting a timing of a dump operation according to embodiments. Referring to FIG. 12, a plurality of dump operations Dump 1, Dump 2, Dump 3, . . . , etc. may be performed according to the number of bits stored in each memory cell. Some dump operations may be performed in a dump section, while the remaining dump operations may be performed in a verification section. For example, Case 1 illustrates a case in which all dump operations Dump 1, Dump 2, Dump 3, . . . , etc. may be performed in the dump section in Case 1, while Case 5 illustrates a case in which all dump operations Dump 1, Dump 2, Dump 3, . . . , etc. are performed in the verification section. Cases 2 to 4 illustrate an example in which some dump operations are performed in the dump section, but the remaining dump operations are performed in the verification section.

Moreover, the timing of the dump operation shown in FIG. 12 may be changed depending on an operating environment or condition of a memory system. That is, the memory system may change a timing of the dump operation, based on at least one piece of information, during a run time.

Referring to FIG. 13, a memory device 300 may include a dump controller 310 and components configured to generate at least one piece of information. In an example, the memory device 300 may include a temperature information generator 321, a state information generator 322, and a loop information generator 323. The temperature information generator 321 may output temperature information Info_T, the state information generator 322 may output state information Info_S, and the loop information generator 323 may generate loop information Info_L. The dump controller 310 may generate a dump control signal Ctrl_set, based on at least one of the temperature information Info_T, the state information Info_S, and the loop information Info_L. In response to the dump control signal Ctrl_set, a timing of the dump operation may be controlled such that some dump operations are performed in the dump section, while some other dump operations are formed in the verification section.

In the above-described embodiment, for brevity, the dump controller 310 has been described as receiving all of the temperature information Info_T, the state information Info_S, and the loop information Info_L. However, the memory device 300 may include only a component configured to generate any one or some pieces of information, and the dump controller 310 may receive only the one or some pieces of information.

The dump controller 310 may increase or reduce the number of dump operations performed in the verification section, based on the above-described pieces of information. In an example, when all the dump operations are performed in the dump section, only bit lines to be actually precharged may be precisely selected in the dump section, and only the selected bit lines may be precharged in the verification section. That is, considering the time required for a verification operation, power required for the verification operation, and verification accuracy, timings at which the dump operations are performed may be adjusted based on the various pieces of information described above.

For example, when a temperature of the memory device 300 is high, a reduction in the power required for the verification operation may be required. Accordingly, the number of dump operations performed in the dump section may be increased. For example, a control operation may be performed such that all the dump operations are performed in the dump section or such that relatively many dump operations are performed in the dump section.

Alternatively, in the memory device 300, a program state to be verified may be determined based on the state information Info_S, and a dump operation may be differently performed according to a position of a selected program state. For example, from a plurality of program states, states having a relatively small interval between threshold voltage distributions (e.g., threshold voltage distributions positioned approximately in the middle from among a plurality of threshold voltage distributions) are verified, the verification accuracy of the states may need to be high. In this case, a control operation may be performed such that all the dump operations are performed in the dump section or a relatively many dump operations are performed in the dump section.

Alternatively, a plurality of program loops may be performed to program data, and a dump operation may be performed based on the loop information Info_L, which indicates the number of times program loops are performed. For example, as the number of times the program loops are performed increases, the number of memory cells that are determined as program pass may increase. Thus, the number of memory cells that are inhibited from being programmed may increase. In this case, because a small number of dump operations are performed in the dump section, even when bit lines corresponding to at least one unselected program state are precharged, the number of bit lines that are precharged simultaneously may be reduced as the number of times the program loops are performed increases. That is, as the number of times the program loops are performed increases, a control operation may be performed such that the number of dump operations performed in the dump section is reduced and the number of dump operations performed in the verification section increases.

Figure 14:
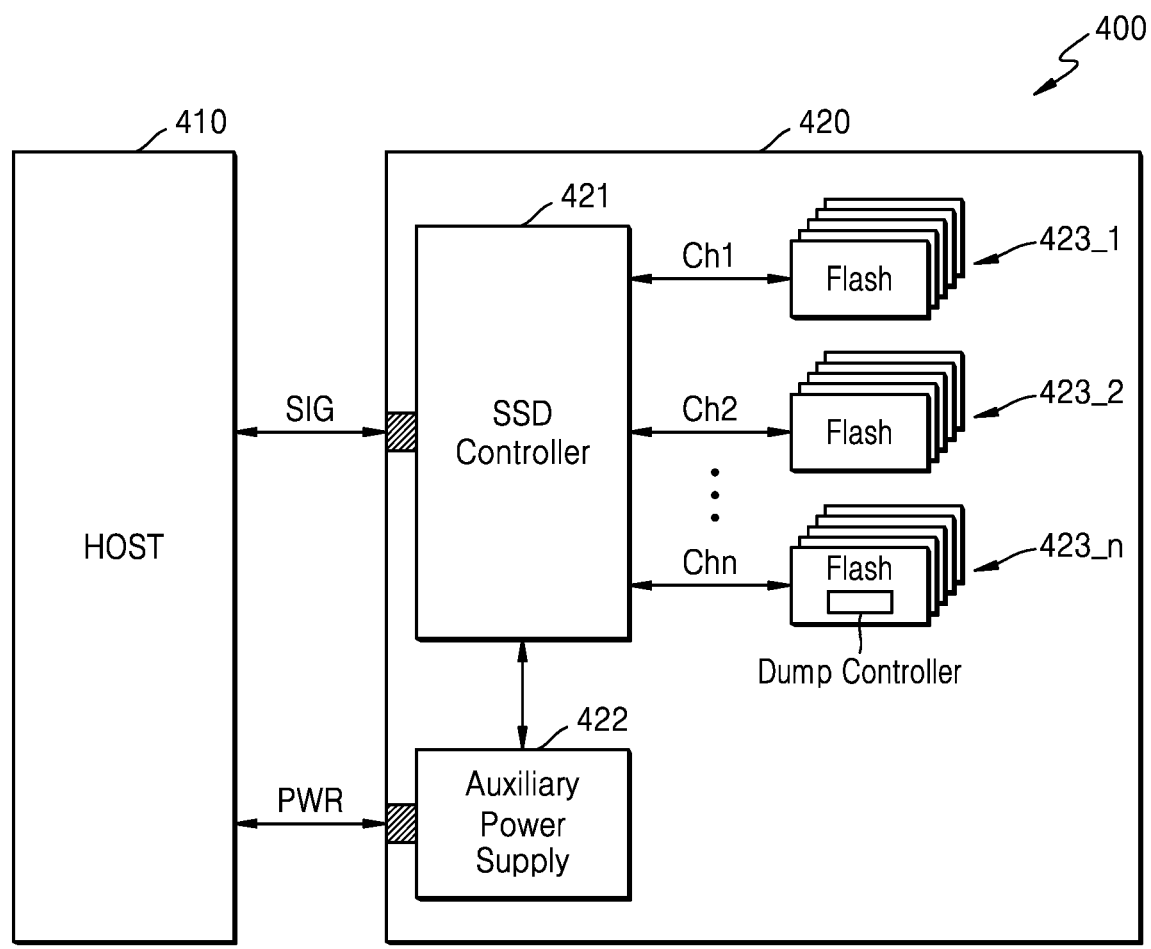
FIG. 14 is a block diagram of an example of applying a memory device according to embodiments to a solid-state disk/drive (SSD) system.

FIG. 14 is a block diagram of an example of applying a memory device according to embodiments to an SSD system 400. Referring to FIG. 14, the SSD system 400 may include a host 410 and an SSD 420. The SSD 420 may transmit and receive a signal to and from the host 410 through a signal connector and receive power through a power connector. The SSD 420 may include an SSD controller 421, an auxiliary power supply 422, and memory devices 423_1 to 423_n. Each of the memory devices 423_1 to 423_n may be a vertically stacked NAND flash memory device. In this case, the SSD 420 may be implemented by using the embodiments described above with reference to FIGS. 1 to 13. That is, each of the memory devices 423_1 to 423_n included in the SSD 420 may include a dump controller. Based on the control of the dump controller, some of a plurality of dump operations may be performed in a dump section, while some other dump operations may be performed in a verification section.

While the inventive concept has been particularly shown and described with reference to embodiments thereof, it will be understood that various changes in form and details may be made therein without departing from the spirit and scope of the following claims.

What is claimed is:
1. A memory device, comprising:
a memory cell array having memory cells therein that are programed to a plurality of program states;
a page buffer circuit having a plurality of page buffers therein that are connected to a plurality of bit lines associated with the memory cell array, with each of the plurality of page buffers: (i) comprising a respective sensing latch that is connected to a corresponding one of the plurality of bit lines, and (ii) configured to control a precharge operation performed on the corresponding one of the plurality of bit lines; and
control logic configured to control: (i) a verification operation performed on the plurality of program states within the memory cells by controlling the page buffer circuit, (ii) a plurality of dump operations on the respective sensing latch, which are based on values of at least two bits stored in each of the page buffers, and (iii) a selective precharge of bit lines that are connected to memory cells to be programmed to a first program state to be verified, from among the plurality of program states;

wherein the control logic controls the plurality of dump operations such that some of the plurality of dump operations are performed in a dump section time interval prior to a verification section time interval, while other ones of the plurality of dump operations are performed during the verification section time interval when the corresponding bit lines therein are precharged;

wherein selected bit lines and unselected bit lines are precharged together based on the dump operations performed during the dump section time interval, with the unselected bit lines being connected to memory cells to be programmed to a second program state that is not verified; and wherein the unselected bit lines are discharged as other dump operations are performed during the verification section time interval.

2. The memory device of claim 1, wherein each of the memory cells stores 2-bit data; wherein the plurality of dump operations include a first dump operation based on a value of a most significant bit (MSB) of the 2-bit data and a second dump operation based on a value of a least significant bit (LSB) of the 2-bit data; and wherein the first dump operation is performed during the dump section time interval, while the second dump operation is performed during the verification section time interval.

3. The memory device of claim 2, wherein the second dump operation is completed before a bit line precharge section time interval within the verification section time interval ends.

4. The memory device of claim 1, wherein each of the memory cells stores 2 or more bits of data; wherein the plurality of dump operations include first to N-th dump operations, wherein N is an integer greater than 2; and wherein some of the first to N-th dump operations are performed during the dump section time interval, and some others of the first to N-th dump operations are performed during the verification section time interval.

5. The memory device of claim 1, wherein the verification section time interval includes a bit line precharge section time interval during which the bit lines are precharged, a sensing node developing section time interval during which voltages of sensing nodes connected to the bit lines are developed, and a sensing section time interval during which the voltages of the sensing nodes are sensed; and wherein the memory cells connected to the selected bit lines are selectively sensed during the sensing section time interval.

6. The memory device of claim 1, wherein each of the memory cells stores 3-bit data; wherein the plurality of dump operations include a first dump operation based on a value of any one of the 3 bits of data, a second dump operation based on a value of another one of the 3 bits of data, and a third dump operation based on a value of a remaining bit of the 3 bits of data; and wherein some of the first to third dump operations are performed during the verification section time interval.

7. The memory device of claim 6, wherein the first and second dump operations are performed during the dump section time interval, and the third dump operation is performed during the verification section time interval.

8. The memory device of claim 6, wherein the first dump operation is performed during the dump section time interval, and the second and third dump operations are performed during the verification section time interval.

9. The memory device of claim 1, wherein the control logic receives information about a number of program loops performed during a program operation; and wherein a number of dump operations performed during the verification section time interval, from among the plurality of dump operations, increases as the number of program loops increases.

10. A method of operating a memory device including a plurality of page buffers located to correspond to a plurality of bit lines connected to memory cells within the memory device, said method comprising:

performing a program loop in response to receipt of a program command;

resetting sensing latches within the plurality of page buffers during a verification of a first program state after the program loop is performed, the first program state being selected from a plurality of program states; then performing a first dump operation by dumping data of a first bit, from among a plurality of bits of data to be programmed, to the sensing latches;

precharging selected bit lines and unselected bit lines together due to the first dump operation, wherein the selected bit lines are connected to memory cells to be programmed to the first program state, from among the plurality of bit lines, and the unselected bit lines are connected to memory cells to be programmed to a second program state different from the first program state;

performing a second dump operation by dumping data of a second bit, from among the plurality of bits of data to be programmed, to the sensing latches; and discharging the unselected bit lines based on the second dump operation.

11. The method of claim 10, wherein, after the program loop is performed, at least one dump operation is performed during a dump section time interval, and a precharge operation on the plurality of bit lines is performed during a verification section time interval; and wherein the first dump operation is performed during the dump section time interval, and the second dump operation is performed during the verification section time interval.

12. The method of claim 11, wherein, during the verification section time interval, the selected bit lines remain precharged.

13. The method of claim 12, further comprising performing a data sensing operation on memory cells that are connected to the selected bit lines and remain precharged.

14. The method of claim 10, wherein the plurality of bits include at least three bits; wherein the method further comprises performing third to N-th dump operations to dump data of bits other than the first and second bits, from among the plurality of bits, to the sensing latches, wherein N is an integer of 3 or more; and wherein some of the third to N-th dump operations are performed during a dump section time interval, and some others of the third to N-th dump operations are performed during a verification section time interval.

15. The method of claim 10, wherein each of the memory cells stores 2-bit data; and wherein the data of the first bit corresponds to most significant bit (MSB) data, and the data of the second bit corresponds to least significant bit (LSB) data.

16. A memory device, comprising:
a memory cell array having memory cells therein that are programmed to a plurality of program states according to a program operation;
a page buffer circuit comprising a plurality of page buffers connected to a plurality of bit lines, with each page buffer including a plurality of data latches configured to store data and a sensing latch configured to control a precharge operation performed on a bit line corresponding thereto; and
a control logic configured to control a verification operation performed on the plurality of program states by controlling the page buffer circuit;
wherein the plurality of page buffers comprise a first page buffer connected to a memory cell to be programmed to a first program state and a second page buffer connected to a memory cell to be programmed to a second program state;
wherein the verification operation performed on a first one of the plurality of program states includes a dump section time interval during which the data stored in the plurality of data latches is dumped to the sensing latch and a verification section time interval during which the plurality of bit lines are precharged, and
wherein the control logic controls a precharge operation such that, after a first bit line connected to the first page buffer and a second bit line connected to the second page buffer are precharged together during the verification section time interval, the second bit line is discharged.

17. The memory device of claim 16, wherein most significant bit (MSB) data and least significant bit (LSB) data are stored in the plurality of data latches; and wherein a first dump operation based on a value of the MSB data is performed during the dump section time interval, and a second dump operation based on a value of the LSB data is performed during the verification section time interval.

18. The memory device of claim 17, wherein MSB data having a value of 0 and LSB data having a value of 1 are stored in the first page buffer, and wherein MSB data having a value of 0 and LSB having a value of 0 are stored in the second page buffer; and wherein when the MSB data having the value of 0 is dumped to the sensing latch during the dump section time interval, both sensing latches of the first page buffer and the second page buffer have a set state.

19. The memory device of claim 18, wherein, when the LSB data having the value of 0 is dumped to the sensing latch during the verification section time interval, the sensing latch of the second page buffer is changed into a reset state; and wherein the second bit line is discharged when the sensing latch of the second page buffer is changed into the reset state.

* * * * *